US009183907B2

(12) United States Patent
Wu et al.

(10) Patent No.: US 9,183,907 B2
(45) Date of Patent: Nov. 10, 2015

(54) VCCMIN FOR A DUAL PORT SYNCHRONOUS RANDOM ACCESS MEMORY (DPSRAM) CELL UTILIZED AS A SINGLE PORT SYNCHRONOUS RANDOM ACCESS MEMORY (SPSRAM) CELL

(71) Applicant: Taiwan Semiconductor Manufacturing Company Limited, Hsin-Chu (TW)

(72) Inventors: Ching-Wei Wu, Nantou County (TW); Cheng Hung Lee, Hsinchu (TW); Chia-Cheng Chen, Taichung (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 240 days.

(21) Appl. No.: 13/687,054

(22) Filed: Nov. 28, 2012

(65) Prior Publication Data
US 2014/0146631 A1 May 29, 2014

(51) Int. Cl.
*G11C 8/00* (2006.01)
*G11C 8/16* (2006.01)
*G11C 8/08* (2006.01)

(52) U.S. Cl.
CPC ... *G11C 8/16* (2013.01); *G11C 8/08* (2013.01)

(58) Field of Classification Search
USPC .................................................... 365/230.05
See application file for complete search history.

(56) References Cited

U.S. PATENT DOCUMENTS

| | | | | |
|---|---|---|---|---|
| 6,088,783 | A * | 7/2000 | Morton | 712/22 |
| 6,732,290 | B1 * | 5/2004 | Perry et al. | 714/6.22 |
| 7,689,941 | B1 * | 3/2010 | Ooi et al. | 716/133 |
| 8,223,573 | B2 * | 7/2012 | Koeppe et al. | 365/210.13 |
| 8,565,009 | B2 * | 10/2013 | Wu et al. | 365/154 |
| 2005/0099375 | A1 * | 5/2005 | Moriyama et al. | 345/98 |
| 2007/0024606 | A1 * | 2/2007 | Moriyama et al. | 345/204 |
| 2010/0271898 | A1 * | 10/2010 | Wu et al. | 365/230.05 |
| 2010/0315859 | A1 * | 12/2010 | Lee | 365/154 |
| 2011/0188328 | A1 * | 8/2011 | Yang et al. | 365/189.16 |
| 2012/0243285 | A1 * | 9/2012 | Ngu et al. | 365/63 |
| 2012/0307548 | A1 * | 12/2012 | Chiu et al. | 365/154 |

OTHER PUBLICATIONS

"A Scaling Trend of Variation-Tolerant SRAM Circuit Design in Deeper Nanometer Era", Hiroyuki Yamauchi, Mar. 2009, Journal of Semiconductor Technology and Science, vol. 9, No. 1, pp. 37-50.

* cited by examiner

*Primary Examiner* — Huan Hoang
*Assistant Examiner* — Pablo Huerta

(57) ABSTRACT

One or more techniques for improving Vccmin for a dual port synchronous random access memory (DPSRAM) cell utilized as a single port synchronous random access memory (SPSRAM) cell are provided herein. In some embodiments, a second word line signal is sent to a second word line of the DPSRAM cell. For example, the second word line signal is sent in response to a logical low at a first bit line or a logical low at a second bit line. In this way, Vccmin is improved for the DPSRAM cell.

20 Claims, 9 Drawing Sheets

600 →

602 — SELECT AT LEAST ONE OF CHANNEL WIDTH, CHANNEL LENGTH, OR CHANNEL WIDTH TO CHANNEL LENGTH RATIO FOR AT LEAST ONE OF FIRST PULL UP TRANSISTOR, SECOND PULL UP TRANSISTOR, FIRST PULL DOWN TRANSISTOR, SECOND PULL DOWN TRANSISTOR, FIRST PASS GATE TRANSISTOR, SECOND PASS GATE TRANSISTOR, THIRD PASS GATE TRANSISTOR, OR FOURTH PASS GATE TRANSISTOR OF DUAL PORT SYNCHRONOUS RANDOM ACCESS MEMORY (DPSRAM) CELL BASED ON SENDING SECOND WORD LINE SIGNAL TO SECOND WORD LINE OF DPSRAM CELL, SECOND WORD LINE CONNECTED TO GATE OF THIRD PASS GATE TRANSISTOR AND GATE OF FOURTH PASS GATE TRANSISTOR, SENDING SECOND WORD LINE SIGNAL IN RESPONSE TO AT LEAST ONE OF LOGICAL LOW AT FIRST BIT LINE CONNECTED TO SOURCE OF FIRST PASS GATE TRANSISTOR OR LOGICAL LOW AT SECOND BIT LINE CONNECTED TO DRAIN OF SECOND PASS GATE TRANSISTOR, THEREBY IMPROVING POWER CONSUMPTION FOR THE DPSRAM CELL

SELECT NUMBER OF DUAL PORT SYNCHRONOUS RANDOM ACCESS MEMORY (DPSRAM) CELLS FOR FIRST BIT LINE OF DPSRAM CELL ARRAY BASED ON PULL DOWN TIME ASSOCIATED WITH CHANGE IN FIRST BIT LINE LEVEL OF FIRST BIT LINE IN RESPONSE TO FIRST WORD LINE SIGNAL SENT TO FIRST WORD LINE, DPSRAM CELL OF DPSRAM CELL ARRAY CONNECTED TO FIRST WORD LINE AND FIRST BIT LINE VIA FIRST PASS GATE TRANSISTOR, THEREBY IMPROVING POWER CONSUMPTION FOR DPSRAM CELL ⟶ 702

FIG. 7

VCCMIN FOR A DUAL PORT SYNCHRONOUS RANDOM ACCESS MEMORY (DPSRAM) CELL UTILIZED AS A SINGLE PORT SYNCHRONOUS RANDOM ACCESS MEMORY (SPSRAM) CELL

BACKGROUND

Generally, a dual port synchronous random access memory (DPSRAM) cell comprises one or more transistors. For example, the DPSRAM cell comprises pull up transistors, pull down transistors, and pass gate transistors. Additionally, the DPSRAM cell is connected to a first word line, a second word line, a first bit line, or a second bit line. However, in some scenarios, when a first DPSRAM cell has a desirable write margin (WM) or a desirable alpha ratio, a second DPSRAM cell is associated with a poor static noise margin (SNM) or a poor beta ratio, thus resulting in potential data corruption in the second DPSRAM cell. In other words, in some scenarios, the SNM and the WM are traditionally related by an inverse proportional relationship such that if one improves, the other is worsened. For example, a desirable SNM generally leads to an undesirable WM, and vice versa. Therefore, traditional DPSRAM cells are designed at a SNM/WM balance point such that neither the SNM nor the WM is optimal.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

In some embodiments, Vccmin for a dual port synchronous random access memory (DPSRAM) cell utilized as a single port synchronous random access memory (SPSRAM) cell is improved by sending a second word line signal to a second word line of the DPSRAM cell in response to at least one of a logical low at a first bit line or a logical low at a second bit line. In some examples, the first bit line is connected to a source of a first pass gate transistor and the second bit line is connected to a drain of a second pass gate transistor. In this way, Vccmin for the DPSRAM cell is improved at least because a beta ratio associated with the DPSRAM cell is determined such that a pass gate transistor does not significantly impact the beta ratio when the second word line signal is sent in response to the logical low at the first bit line or the second bit line.

In some embodiments, Vccmin for a dual port synchronous random access memory (DPSRAM) cell utilized as a single port synchronous random access memory (SPSRAM) cell is improved by selecting at least one of a channel width, a channel length, or a channel width to channel length ratio for at least one of a first pull up transistor, a second pull up transistor, a first pull down transistor, a second pull down transistor, a first pass gate transistor, a second pass gate transistor, a third pass gate transistor, or a fourth pass gate transistor of the DPSRAM cell. In some examples, this selection is based on a second word line signal sent to a second word line of the DPSRAM cell in response to at least one of a logical low at a first bit line or a logical low at a second bit line. In this way, Vccmin for the DPSRAM cell is improved at least because such transistors are independently sized, rather than requiring a balance between a static noise margin (SNM) and a write margin (WM).

In some embodiments, Vccmin for a dual port synchronous random access memory (DPSRAM) cell utilized as a single port synchronous random access memory (SPSRAM) cell is improved by selecting a number of DPSRAM cells for a first bit line of a DPSRAM cell array based on a pull down time associated with a change in a first bit line level of the first bit line in response to a first word line signal sent to a first word line. In some embodiments, a DPSRAM cell of the DPSRAM cell array is connected to the first word line and the first bit line via a first pass gate transistor. In this way, Vccmin for the DPSRAM cell is improved at least because a timing associated with the first bit line is controlled based on the number of DPSRAM cells selected for the first bit line.

The following description and annexed drawings set forth certain illustrative aspects and implementations. These are indicative of but a few of the various ways in which one or more aspects are employed. Other aspects, advantages, or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements or structures of the drawings are not necessarily be drawn to scale. Accordingly, the dimensions of the various features may be arbitrarily increased or reduced for clarity of discussion.

FIG. 6 is a flow diagram of an example method for improving Vccmin for a dual port synchronous random access memory (DPSRAM) cell utilized as a single port synchronous random access memory (SPSRAM) cell, according to some embodiments.

FIG. 7 is a flow diagram of an example method for improving Vccmin for a dual port synchronous random access memory (DPSRAM) cell utilized as a single port synchronous random access memory (SPSRAM) cell, according to some embodiments.

DETAILED DESCRIPTION

Figure 1:
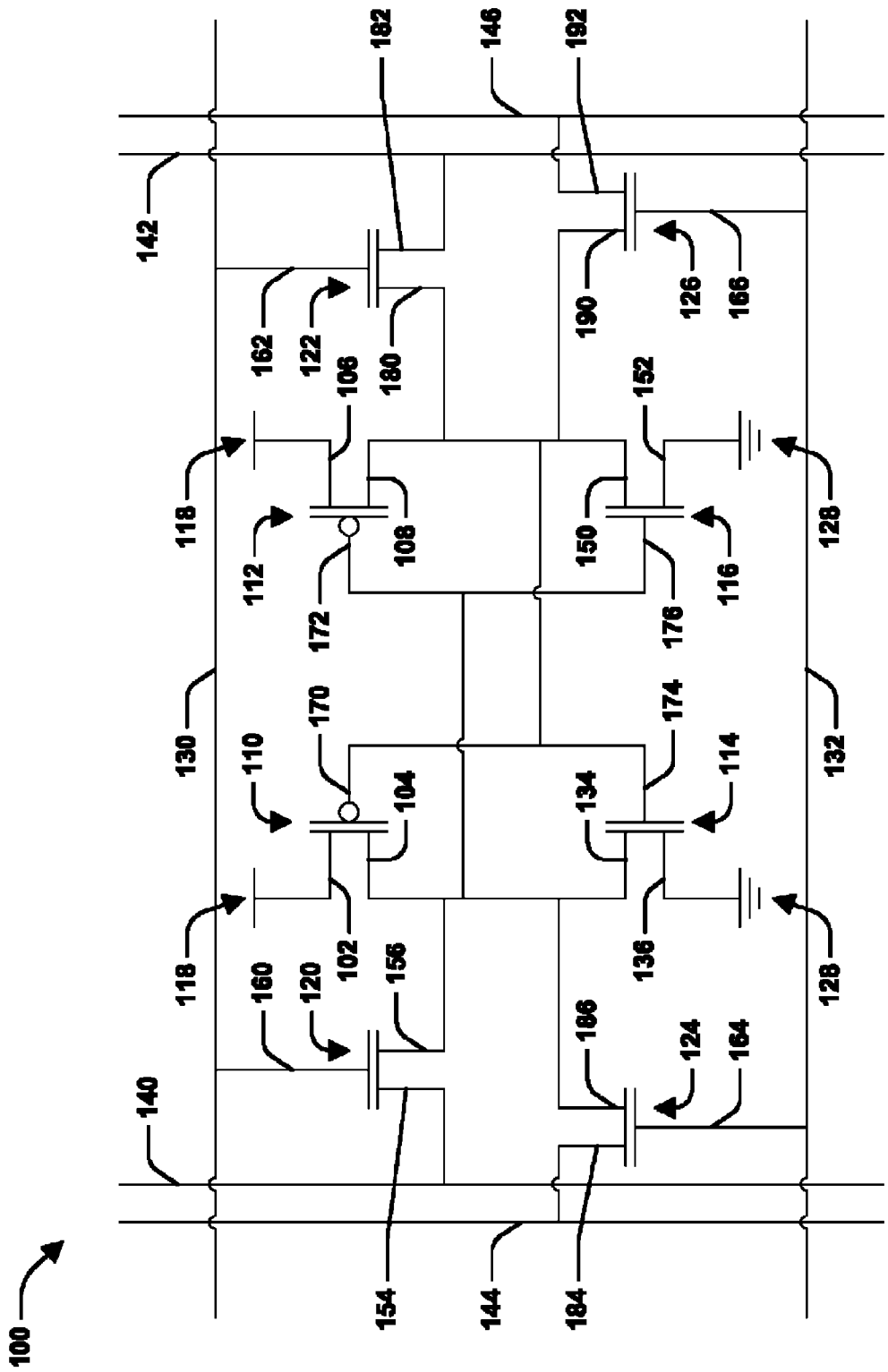
FIG. 1 is a schematic diagram of an example dual port synchronous random access memory (DPSRAM) cell, according to some embodiments.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter.

Generally, a synchronous random access memory (DPSRAM) cell is associated with a Vccmin voltage. For example, a minimum voltage at which the DPSRAM cell operates reliably is the Vccmin voltage. Accordingly, an improvement in a write margin (WM) or associated alpha ratio is generally associated with an improvement or decrease in the Vccmin voltage. In other words, a lower Vccmin is associated with a desirable WM. Traditionally, however, the improvement in the WM leads to a worse static noise margin (SNM) or a lower beta ratio. In some embodiments, a turn on sequence associated with a word line and a bit line of the DPSRAM cell is controlled such that the improvement in the WM yields an improved SNM, thereby improving Vccmin for the DPSRAM cell utilized as a single port synchronous random access memory (SPSRAM) cell. In other words, the DPSRAM cell achieves a desirable SNM, a desirable or larger beta ratio, a desirable WM, or a desirable or smaller alpha ratio by controlling a turn on sequence associated with a word line and a bit line of the DPSRAM cell. For example, as the beta ratio increases, the SNM becomes more desirable, decreasing the Vccmin voltage, thus reducing Vccmin accordingly. Generally desirable to decrease the alpha ratio associated with a DPSRAM cell performing a write operation. In some embodiments, it will be appreciated that an associated MUX-N design is implemented, for example.

FIG. 1 is a schematic diagram 100 of an example dual port synchronous random access memory (DPSRAM) cell, according to some embodiments. For example, the DPSRAM cell comprises a first pull up transistor 110, a second pull up transistor 112, a first pull down transistor 114, a second pull down transistor 116, a first pass gate transistor 120, a second pass gate transistor 122, a third pass gate transistor 124, and a fourth pass gate transistor 126. In some embodiments, the DPSRAM cell is an eight transistor (8T) cell. Additionally, the DPSRAM cell is a Foundry standard DPSRAM cell in other embodiments, for example. In some embodiments, a gate of the first pass gate transistor 160 and a gate of the second pass gate transistor 162 are connected to a first word line 130. Additionally, a gate of the third pass gate transistor 164 and a gate of the fourth pass gate transistor 166 are connected to a second word line 132.

In some embodiments, a source of the first pass gate transistor 154 is connected to a first bit line 140, and a drain of the first pass gate transistor 156 is connected to a drain of the first pull up transistor 104, a drain of the third pass gate transistor 186, a drain of the first pull down transistor 134, a gate of the second pull up transistor 172, and a gate of the second pull down transistor 176. In some embodiments, a source of the second pass gate transistor 180 is connected to a drain of the second pull up transistor 108, a source of the fourth pass gate transistor 190, a drain of the second pull down transistor 150, a gate of the first pull up transistor 170, and a gate of the first pull down transistor 174. Additionally, a drain of the second pass gate transistor 182 is connected to a second bit line 142. In some embodiments, a source of the third pass gate transistor 184 is connected to a third bit line 144, and the drain of the third pass gate transistor 186 is connected to the drain of the first pull down transistor 134, the drain of the first pull up transistor 104, the drain of first pass gate transistor 156, the gate of the second pull up transistor 172, and the gate of the second pull down transistor 176. In some embodiments, the source of the fourth pass gate transistor 190 is connected to the drain of the second pull down transistor 150, the drain of the second pull up transistor 108, the source of the second pass gate transistor 180, the gate of the first pull up transistor 170, and the gate of the first pull down transistor 174. Additionally, a drain of the fourth pass gate transistor 192 is connected to a fourth bit line 146.

In some embodiments, a source of the first pull up transistor 102 and a source of the second pull up transistor 106 are connected to a positive supply voltage 118. In some embodiments, the positive supply voltage 118 is Vdd, for example. In some embodiments, a source of the first pull down transistor 136 and a source of the second pull down transistor 152 are connected to a negative supply voltage 128. In some embodiments, the negative supply voltage 128 is Vss or ground 128, for example.

In some embodiments, the drain of the first pull up transistor 104 is connected to the drain of first pass gate transistor 156, the drain of the third pass gate transistor 186, the drain of the first pull down transistor 134, the gate of the second pull up transistor 172, and the gate of the second pull down transistor 176. In some embodiments, the drain of the second pull up transistor 108 is connected to the source of the second pass gate transistor 180, the source of the fourth pass gate transistor 190, the drain of the second pull down transistor 150, the gate of the first pull up transistor 170, and the gate of the first pull down transistor 174. In some embodiments, the drain of the first pull down transistor 134 is connected to the drain of first pass gate transistor 156, the drain of the third pass gate transistor 186, the drain of the first pull up transistor 104, the gate of the second pull up transistor 172, and the gate of the second pull down transistor 176. In some embodiments, the drain of the second pull down transistor 150 is connected to the source of the second pass gate transistor 180, the source of the fourth pass gate transistor 190, the drain of the second pull up transistor 108, the gate of the first pull up transistor 170, and the gate of the first pull down transistor 174.

In some embodiments, the gate of the first pull up transistor 170 is connected to the gate of the first pull down transistor 174, the drain of the second pull up transistor 108, the drain of the second pull down transistor 150, the source of the second pass gate transistor 180, and the source of the fourth pass gate transistor 190. In some embodiments, the gate of the second pull up transistor 172 is connected to the gate of the second pull down transistor 176, the drain of the first pull up transistor 104, the drain of the first pull down transistor 134, the drain of the first pass gate transistor 156, and the drain of the third pass gate transistor 186. In some embodiments, the gate of the third pull up transistor 174 is connected to the gate of the first pull up transistor 170, the drain of the second pull up transistor 108, the drain of the second pull down transistor 150, the source of the second pass gate transistor 180, and the source of the fourth pass gate transistor 190. In some embodiments, the gate of the second pull down transistor 176 is connected to the gate of the second pull up transistor 172, the drain of the first pull up transistor 104, the drain of the first pull down transistor 134, the drain of the first pass gate transistor 156, and the drain of the third pass gate transistor 186.

In some embodiments, a first word line signal is sent to the first word line 130 of the DPSRAM cell. Additionally, a second word line signal is sent to the second word line 132 of the DPSRAM cell in response to at least one of a logical low at the first bit line 140 or a logical low at the second bit line 142. In other words, the second word line signal is sent to the second word line 132 of the DPSRAM cell after at least one of a logical low at the first bit line 140 is detected or a logical low at the second bit line 142 is detected, for example. When the first word line signal is sent to the first word line 130, at least one of the first pass gate transistor 120 or the second pass gate transistor 122 is turned on at least because the gate of the first pass gate transistor 160 and the gate of the second pass gate transistor 162 are biased to a logical high based on the first word line signal sent to the first word line 130. Therefore, at least one of the first bit line 140 or the second bit line 142 drops from the logical high to a logical low when the first word line signal is sent at least because at least one of the first pass gate transistor 120 or the second pass gate transistor 122 is switched on, connecting at least one of the first bit line 140 or the second bit line 142 to ground 128 via the first pull down transistor 114 or the second pull down transistor 116, respectively. Accordingly, when the first pass gate transistor 120 or the second pass gate transistor 122 is connected to ground 128 for a time sufficient to enable at least one of the first bit line 140 or the second bit line 142 to fall to a logical low, an impact of a pass gate is mitigated with respect to a beta ratio associated with the DPSRAM cell. For example, if PG2 is a channel width to channel length ratio for the second pass gate transistor 122, PG4 is a channel width to channel length ratio for the fourth pass gate transistor 126, and PD2 is a channel width to channel length ratio for the second pull down transistor 116, $\beta=PD2/PG4$, rather than $\beta=PD2/(PG2+PG4)$ when the second word line signal is sent to the second word line 132 of the DPSRAM cell before at least one of a logical low at the first bit line 140 is detected or a logical low at the second bit line 142 is detected, for example.

Figure 2:
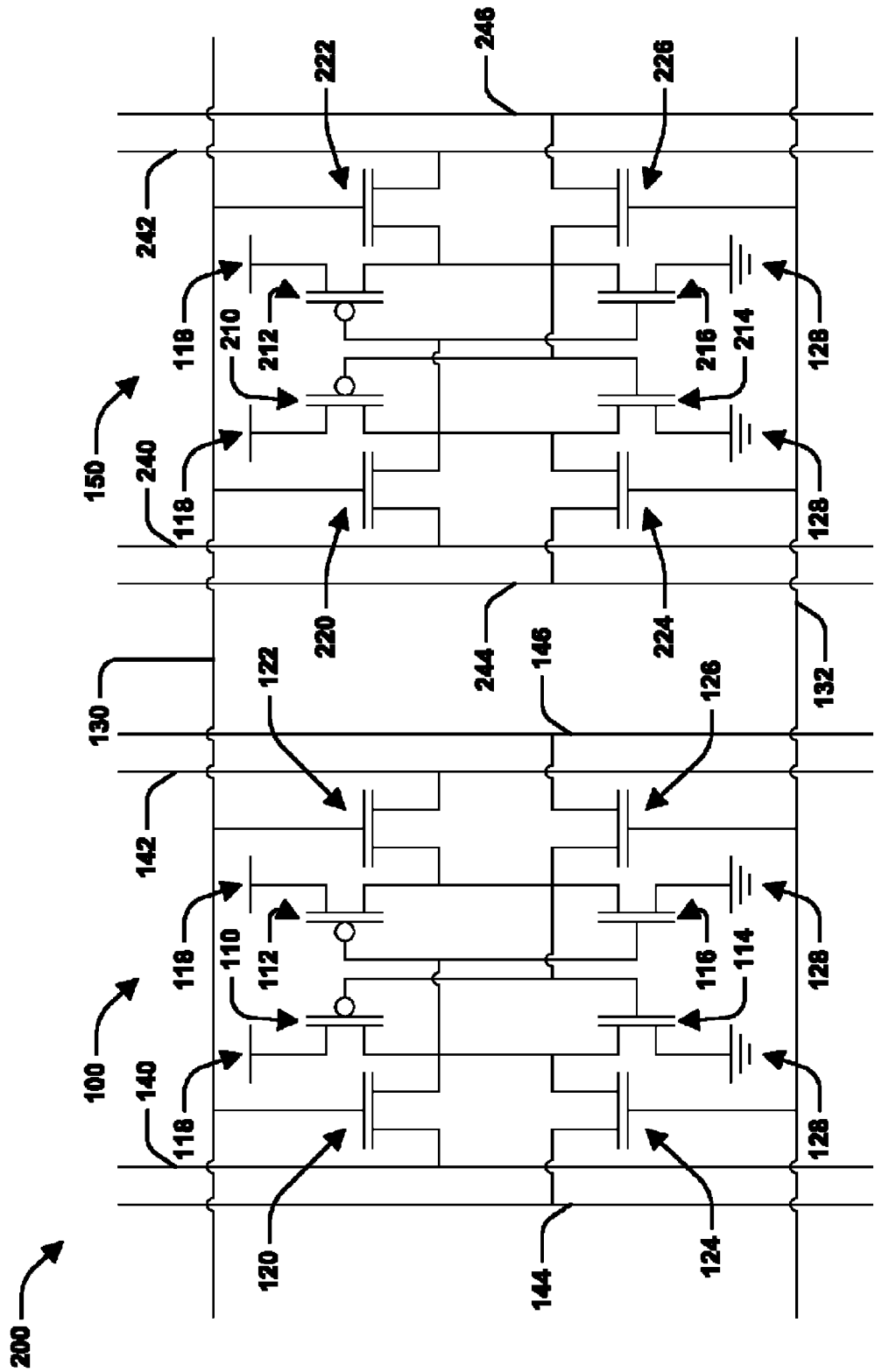
FIG. 2 is a schematic diagram of example dual port synchronous random access memory (DPSRAM) cells, according to some embodiments.

FIG. 2 is a schematic diagram 200 of example dual port synchronous random access memory (DPSRAM) cells, according to some embodiments. For example, the schematic diagram 200 comprises a first DPSRAM cell 100 and a second DPSRAM cell 150. In some embodiments, the first DPSRAM cell is the DPSRAM cell 100 of FIG. 1. Accordingly, the second DPSRAM cell 150 comprises a configuration similar to a configuration of the first DPSRAM cell 100. It will be appreciated that in some embodiments, the second DPSRAM cell 150 comprises a configuration identical to the configuration of the first DPSRAM cell 100 of FIG. 1. In some embodiments, the second DPSRAM cell 150 comprises a third pull up transistor 210, a fourth pull up transistor 212, a third pull down transistor 214, a fourth pull down transistor 216, a fifth pass gate transistor 220, a sixth pass gate transistor 222, a seventh pass gate transistor 224, and an eighth pass gate transistor 226. In some embodiments, a gate of the fifth pass gate transistor 220 and a gate of the sixth pass gate transistor 222 are connected to the first word line 130. Additionally, a gate of the seventh pass gate transistor 224 and a gate of the eighth pass gate transistor 226 are connected to the second word line 132. In some embodiments, a source of the fifth pass gate transistor 220 is connected to a fifth bit line 240. Additionally, a drain of the sixth pass gate transistor 222 is connected to a sixth bit line 242. In some embodiments, a source of the seventh pass gate transistor 224 is connected to a seventh bit line 244. Additionally, a drain of the eighth pass gate transistor 226 is connected to an eighth bit line 246.

In some embodiments, respective transistors of FIG. 2 are associated with a channel width, a channel length, or a channel width to channel length ratio. For example, the third pull up transistor 210 is associated with a third pull up transistor ratio equal to a channel width of the third pull up transistor 210 divided by a channel length of the third pull up transistor 210. In some embodiments, the channel width to channel length ratio of at least some of the first pass gate transistor 120, the second pass gate transistor 122, the third pass gate transistor 124, the fourth pass gate transistor 126, the fifth pass gate transistor 220, the sixth pass gate transistor 222, the seventh pass gate transistor 224, or the eighth pass gate transistor 226 are substantially the same.

In some embodiments, the first DPSRAM cell 100 performs a read operation and the second DPSRAM cell 150 performs a dummy read operation. For example, a first word line signal is sent to a first word line 130. In some examples, sending the first word line signal to the first word line 130 comprises sending a logical high to the first word line 130. Accordingly, the first word line 130 is connected to the first DPSRAM cell 100 and the second DPSRAM cell 150. For example, the first word line 130 is connected to a gate of the first pass gate transistor 120, a gate of the second pass gate transistor 122, a gate of the fifth pass gate transistor 220, a gate of the sixth pass gate transistor 222. When the first DPSRAM cell 100 performs the read operation and the second DPSRAM cell 150 performs the dummy read operation, merely the first word line signal is sent to the first word line 130. In other words, a second word line 132 is off or is not sent a second word line signal, for example. Therefore, a static noise margin (SNM) associated with the first DPSRAM cell 100 and a SNM associated with the second DPSRAM cell 150 are both desirable at least because the second word line 132 is off.

In some examples, PD1 is a channel width to channel length ratio for the first pull down transistor 114, PD2 is a channel width to channel length ratio for the second pull down transistor 116, PG1 is a channel width to channel length ratio for the first pass gate transistor 120, and PG2 is a channel width to channel length ratio for the second pass gate transistor 122.

Accordingly, a beta ratio associated with the first DPSRAM cell 100 is at least one of:

$\beta=PD1/PG1$; or $\beta=PD2/PG2$.

Similarly, PD3 is a channel width to channel length ratio for the third pull down transistor 214, PD4 is a channel width to channel length ratio for the fourth pull down transistor 216, PG5 is a channel width to channel length ratio for the fifth pass gate transistor 220, and PG6 is a channel width to channel length ratio for the sixth pass gate transistor 222.

Accordingly, a beta ratio associated with the second DPSRAM cell 150 is at least one of:

$\beta=PD3/PG5$; or $\beta=PD4/PG6$.

In some embodiments, the first DPSRAM cell 100 performs a dummy read operation and the second DPSRAM cell 150 performs a write operation. For example, a first word line signal is sent to a first word line 130, such as by sending a logical high to the first word line 130. Accordingly, the first word line 130 is connected to the first DPSRAM cell 100 and the second DPSRAM cell 150. For example, the first word line 130 is connected to a gate of the first pass gate transistor 120, a gate of the second pass gate transistor 122, a gate of the fifth pass gate transistor 220, a gate of the sixth pass gate transistor 222. When the first DPSRAM cell 100 performs the write operation, the second word line signal is sent to the second word line 132. According to some aspects, the second word line signal is sent to the second word line 132 by sending a logical high to the second word line 132, for example.

In some examples, PU1 is a channel width to channel length ratio for the first pull up transistor 110, PU2 is a channel width to channel length ratio for the second pull up transistor 112, PU3 is a channel width to channel length ratio for the third pull up transistor 210, PU4 is a channel width to channel length ratio for the fourth pull up transistor 212, PG1 is a channel width to channel length ratio for the first pass gate transistor 120, PG2 is a channel width to channel length ratio for the second pass gate transistor 122, PG3 is a channel width to channel length ratio for the third pass gate transistor 124, PG4 is a channel width to channel length ratio for the fourth pass gate transistor 126, PG5 is a channel width to channel length ratio for the fifth pass gate transistor 220, PG6 is a channel width to channel length ratio for the sixth pass gate transistor 222, PG7 is a channel width to channel length ratio for the seventh pass gate transistor 224, PG8 is a channel width to channel length ratio for the eighth pass gate transistor 226, PD1 is a channel width to channel length ratio for the first pull down transistor 114, and PD2 is a channel width to channel length ratio for the second pull down transistor 116, PD3 is a channel width to channel length ratio for the third pull down transistor 214, and PD4 is a channel width to channel length ratio for the fourth pull down transistor 216.

Accordingly, an alpha ratio associated with the second DPSRAM cell 150 when the first word line signal is sent to the first word line 130 and no signal is sent to the second word line 132 is at least one of:

$$\alpha = PU3/PG5; \text{ or}$$

$$\alpha = PU4/PG6.$$

The alpha ratio associated with the second DPSRAM cell 150 when the first word line signal is sent to the first word line 130 and the second word line signal is sent to the second word line 132 after at least one of detecting a logical low in a first bit line or detecting a logical low in a second bit line is at least one of:

$$\alpha = PU3/(PG5+PG7); \text{ or}$$

$$\alpha = PU4/(PG6+PG8).$$

In some embodiments, a beta ratio associated with the first DPSRAM cell 100 when the first word line signal is sent to the first word line 130 and no signal is sent to the second word line 132 is at least one of:

$$\beta = PD1/PG1; \text{ or}$$

$$\beta = PD2/PG2.$$

The beta ratio associated with the first DPSRAM cell 100 when the first word line signal is sent to the first word line 130 and the second word line signal is sent to the second word line 132 after at least one of detecting a logical low in a first bit line or detecting a logical low in a second bit line is at least one of:

$$\beta = PD1/PG3; \text{ or}$$

$$\beta = PD2/PG4.$$

For example, when the second word line signal is sent to the second word line 132 after at least one of detecting a logical low in a first bit line 140 or detecting a logical low in a second bit line 142, a write margin (WM) or alpha ratio associated with the second DPSRAM cell 150 is desirable and a static noise margin (SNM) or beta ratio associated with the first DPSRAM cell 100 is desirable at least because at least one of the first bit line 140 or the second bit line 142 is discharged, for example.

In some embodiments, a second word line signal is sent to a second word line 132 in response to a voltage difference between the first bit line 140 and the second bit line 142. In other words, the second word line is sent to the second word line 132 when at least one of the first bit line 140 is at a logical high and the second bit line 142 is at a logical low or vice versa.

In some embodiments, a number of DPSRAM cells is selected or connected to a bit line to control a response time associated with at least one of the first bit line falling to the logical low or the second bit line falling to the logical low. For example, when fewer DPSRAM cells are connected to a bit line, the response time associated with the bit line falling to the logical low is decreased. Conversely, when more DPSRAM cells are connected to the bit line, the response time associated with the bit line falling to the logical low is increased.

In some embodiments at least one of the first DPSRAM cell 100 or the second DPSRAM cell 150 performs a read modify write operation to facilitate a decrease in response time associated with at least one of the first bit line falling to the logical low or the second bit line falling to the logical low. In some examples, the read modify write is performed in response to a first word line signal sent to a first word line, for example. For example, the read modify write operation is performed based on at least one of a number of DPSRAM cells connected to the first bit line in a DPSRAM cell array or a number of DPSRAM cells connected to the second bit line in the DPSRAM cell array. In some embodiments, the second word line signal is sent to the second word line of the DPSRAM cell in response to the read modify write operation, for example.

In some embodiments, at least one of a read or a dummy read performed by at least one of the first DPSRAM cell 100 or the second DPSRAM cell 150 is based on differential sensing associated with at least one of the first bit line 140, the second bit line 142, the third bit line 144, the fourth bit line 146, the fifth bit line 240, the sixth bit line 242, the seventh bit line 244, or the eighth bit line 246.

It will be appreciated that in some embodiments, the fifth bit line 240 is a first bit line of the second DPSRAM cell 150, the sixth bit line 242 is a second bit line of the second DPSRAM cell 150, the seventh bit line 244 is a third bit line of the second DPSRAM cell 150, or the eighth bit line 246 is a fourth bit line of the second DPSRAM cell 150. Similarly, in some embodiments, the third pull up transistor 210 is a first pull up transistor of the second DPSRAM cell 150, the fourth pull up transistor 212 is a second pull up transistor of the second DPSRAM cell 150, the third pull down transistor 214 is a first pull down transistor of the second DPSRAM cell 150, the fourth pull down transistor 216 is a second pull down transistor of the second DPSRAM cell 150, the fifth pass gate transistor 220 is a first pass gate transistor of the second DPSRAM cell 150, the sixth pass gate transistor 222 is a second pass gate transistor of the second DPSRAM cell 150, the seventh pass gate transistor 224 is a third pass gate transistor of the second DPSRAM cell 150, and the eighth pass gate transistor 226 is a fourth pass gate transistor of the second DPSRAM cell 150, etc.

Figure 3:
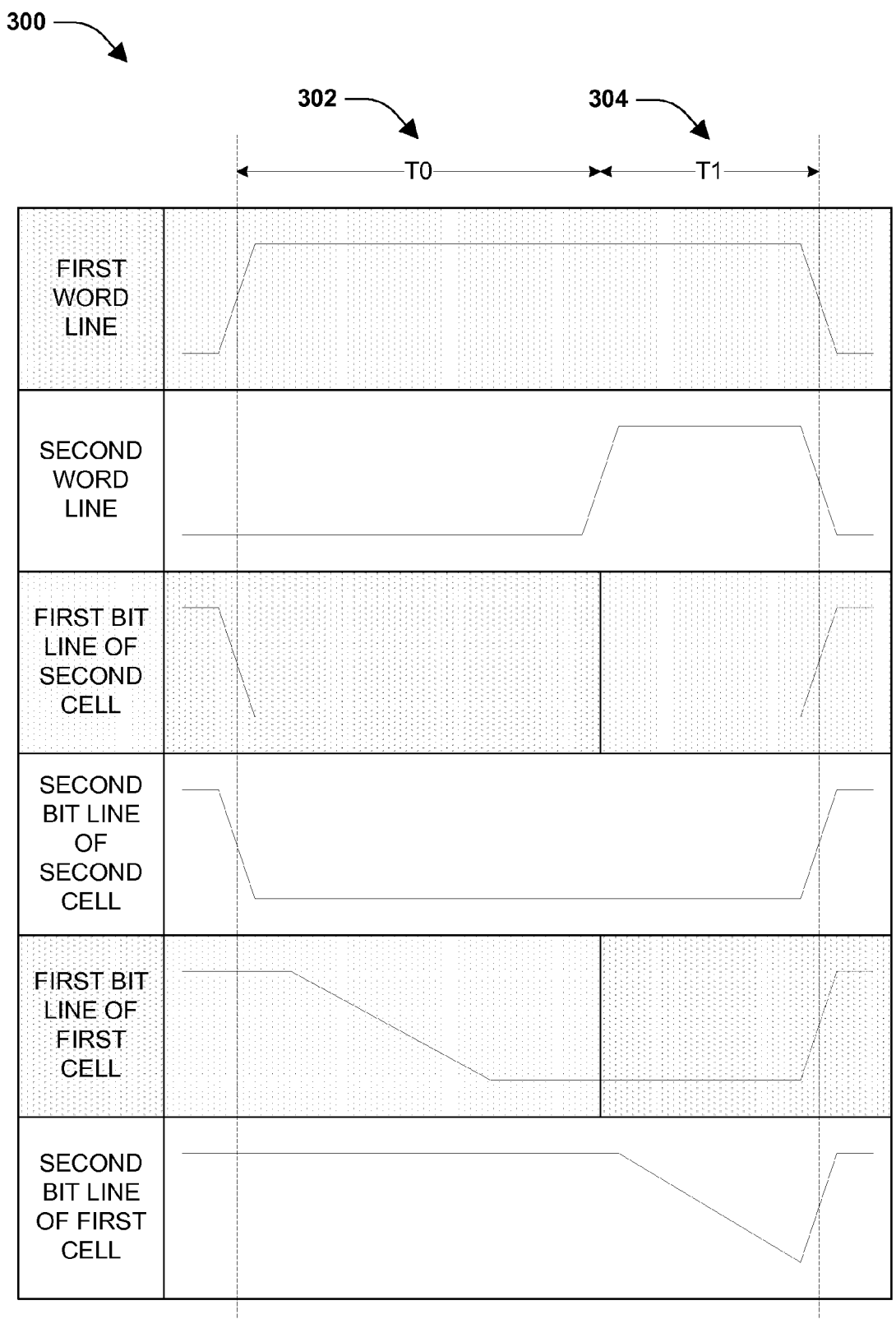
FIG. 3 is a timing diagram for example dual port synchronous random access memory (DPSRAM) cells, according to some embodiments.

FIG. 3 is a timing diagram 300 for example dual port synchronous random access memory (DPSRAM) cells, according to some embodiments. In some embodiments, a first cell, such as the first DPSRAM cell 100 of FIG. 2 performs a dummy read operation and a second cell, such as the second DPSRAM cell 150 of FIG. 2 performs a write operation. For example, time T0 302 is associated with a first word line rising, such as the first word line 130 of FIG. 2. In some embodiments, a first word line signal is sent to a first word line 130 at time T0 302. During T0 302, a second word line, such as the second word line 132 of FIG. 2 is off, and thus not sent any signal, for example. A first bit line and a second bit line, such as the third bit line 240 and the fourth bit line 242 of the second DPSRAM cell 150 of FIG. 2, fall to a logical low at time T0 302 at least because the first word line 130 activates the fifth pass gate transistor 220 and the sixth pass gate transistor 222 to connect respective bit lines to ground 128. Additionally, the first bit line of the first cell, such as the first bit line 140 falls to a logical low during time T0 302. In some embodiments, the first bit line 140 of the first DPSRAM cell 100 falls slower than the third bit line 240 and the fourth bit line 242 of the second DPSRAM cell 150 at least because the first DPSRAM cell 100 is performing the dummy read operation, while the second DPSRAM cell 150 is performing the write operation. At time T1 304, a second word line, such as the second word line 132 of FIG. 2, is sent a second word line signal in response to the first bit line 140 falling to the logical low during time T0 302. Additionally, a second bit line of the first DPSRAM cell 100, such as the second bit line 142 of FIG. 2, discharges momentarily during time T1 304.

In some examples, according to FIG. 2 and FIG. 3, PU1 is a channel width to channel length ratio for the first pull up transistor 110, PU2 is a channel width to channel length ratio for the second pull up transistor 112, PU3 is a channel width to channel length ratio for the third pull up transistor 210, PU4 is a channel width to channel length ratio for the fourth pull up transistor 212, PG1 is a channel width to channel length ratio for the first pass gate transistor 120, PG2 is a channel width to channel length ratio for the second pass gate transistor 122, PG3 is a channel width to channel length ratio for the third pass gate transistor 124, PG4 is a channel width to channel length ratio for the fourth pass gate transistor 126, PG5 is a channel width to channel length ratio for the fifth pass gate transistor 220, PG6 is a channel width to channel length ratio for the sixth pass gate transistor 222, PG7 is a channel width to channel length ratio for the seventh pass gate transistor 224, PG8 is a channel width to channel length ratio for the eighth pass gate transistor 226, PD1 is a channel width to channel length ratio for the first pull down transistor 114, and PD2 is a channel width to channel length ratio for the second pull down transistor 116, PD3 is a channel width to channel length ratio for the third pull down transistor 214, and PD4 is a channel width to channel length ratio for the fourth pull down transistor 216.

In this example, an alpha ratio associated with the second DPSRAM cell 150 at time T0 302 is at least one of:

$\alpha = PU3/PG5$; or $\alpha = PU4/PG6$.

The alpha ratio associated with the second DPSRAM cell 150 at time T1 304 is at least one of:

$\alpha = PU3/(PG5+PG7)$; or $\alpha = PU4/(PG6+PG8)$.

In some embodiments, a beta ratio associated with the first DPSRAM cell 100 at time T0 302 is at least one of:

$\beta = PD1/PG1$; or $\beta = PD2/PG2$.

The beta ratio associated with the first DPSRAM cell 100 at time T1 304 is at least one of:

$\beta = PD1/PG3$; or $\beta = PD2/PG4$.

In this way a desirable write margin (WM) or desirable alpha ratio associated with the second DPSRAM cell 150 is provided. Similarly, a desirable static noise margin (SNM) or a desirable beta ratio associated with the first DPSRAM cell 100 is provided at least because at least one of the first bit line 140 or the second bit line 142 is discharged, for example.

Figure 4:
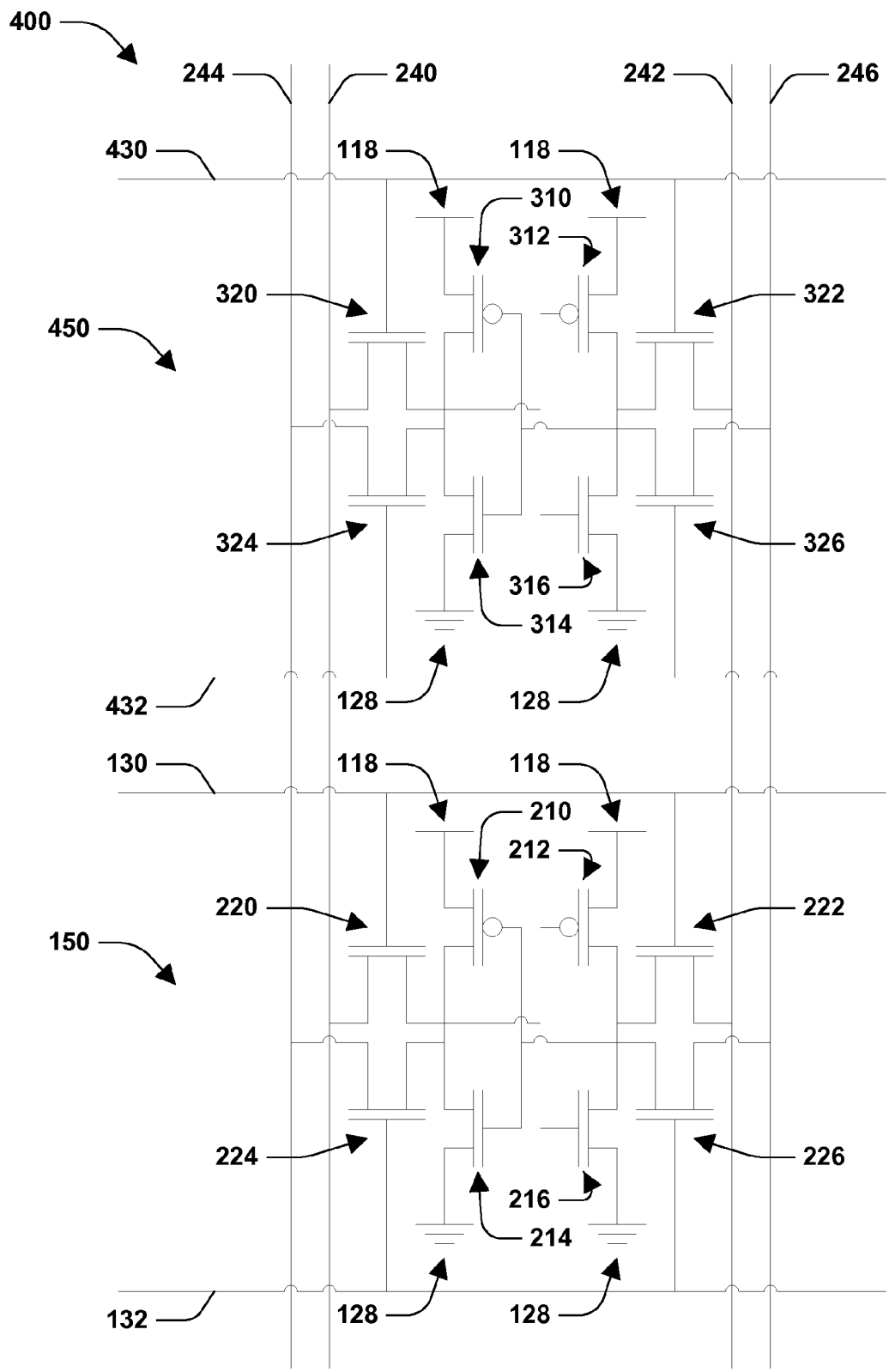
FIG. 4 is a schematic diagram of example dual port synchronous random access memory (DPSRAM) cells, according to some embodiments.

FIG. 4 is a schematic diagram 400 of example dual port synchronous random access memory (DPSRAM) cells, according to some embodiments. For example, the schematic diagram 400 comprises a second DPSRAM cell 150 and a third DPSRAM cell 450. In some embodiments, the second DPSRAM cell is the DPSRAM cell 150 of FIG. 2. Accordingly, the second DPSRAM cell 150 and the third DPSRAM cell 450 comprise a configuration similar to a configuration of the first DPSRAM cell 100 of FIG. 1, for example. It will be appreciated that in some embodiments, the second DPSRAM cell 150 and the third DPSRAM cell 450 comprise a configuration identical to the configuration of the first DPSRAM cell 100 of FIG. 1. In some embodiments, the third DPSRAM cell 450 comprises a fifth pull up transistor 310, a sixth pull up transistor 312, a fifth pull down transistor 314, a sixth pull down transistor 316, a ninth pass gate transistor 320, a tenth pass gate transistor 322, an eleventh pass gate transistor 324, and a twelfth pass gate transistor 326. In some embodiments, a gate of the ninth pass gate transistor 320 and a gate of the tenth pass gate transistor 322 are connected to a third word line 430. Additionally, a gate of the eleventh pass gate transistor 324 and a gate of the twelfth pass gate transistor 326 are connected to the fourth word line 432. In some embodiments, a source of the ninth pass gate transistor 320 is connected to a fifth bit line 240. Additionally, a drain of the tenth pass gate transistor 322 is connected to a sixth bit line 242. In some embodiments, a source of the eleventh pass gate transistor 324 is connected to a seventh bit line 244. Additionally, a drain of the twelfth pass gate transistor 326 is connected to an eighth bit line 246.

In some embodiments, a number of DPSRAM cells is selected or connected to a bit line based on a response time associated with a bit line level falling from a logical high to a logical low. For example, a fourth DPSRAM cell is connected to at least one of the fifth bit line 240, the sixth bit line 242, the seventh bit line 244, or the eighth bit line 246. Similarly, additional DPSRAM cells are connected until a desired number of DPSRAM cells are connected to respective bit lines, for example. The desired number of DPSRAM cells is associated with a response time for a bit line of the respective bit lines to fall to a logical low level when at least one of the DPSRAM cells connected to the respective bit lines is performing a dummy read, for example. In other words, a greater number of DPSRAM cells connected to the respective bit lines is associated with an increase in response time, while a fewer number of DPSRAM cells connected to the respective bit lines is associated with a decrease in response time, for example.

Figure 5:
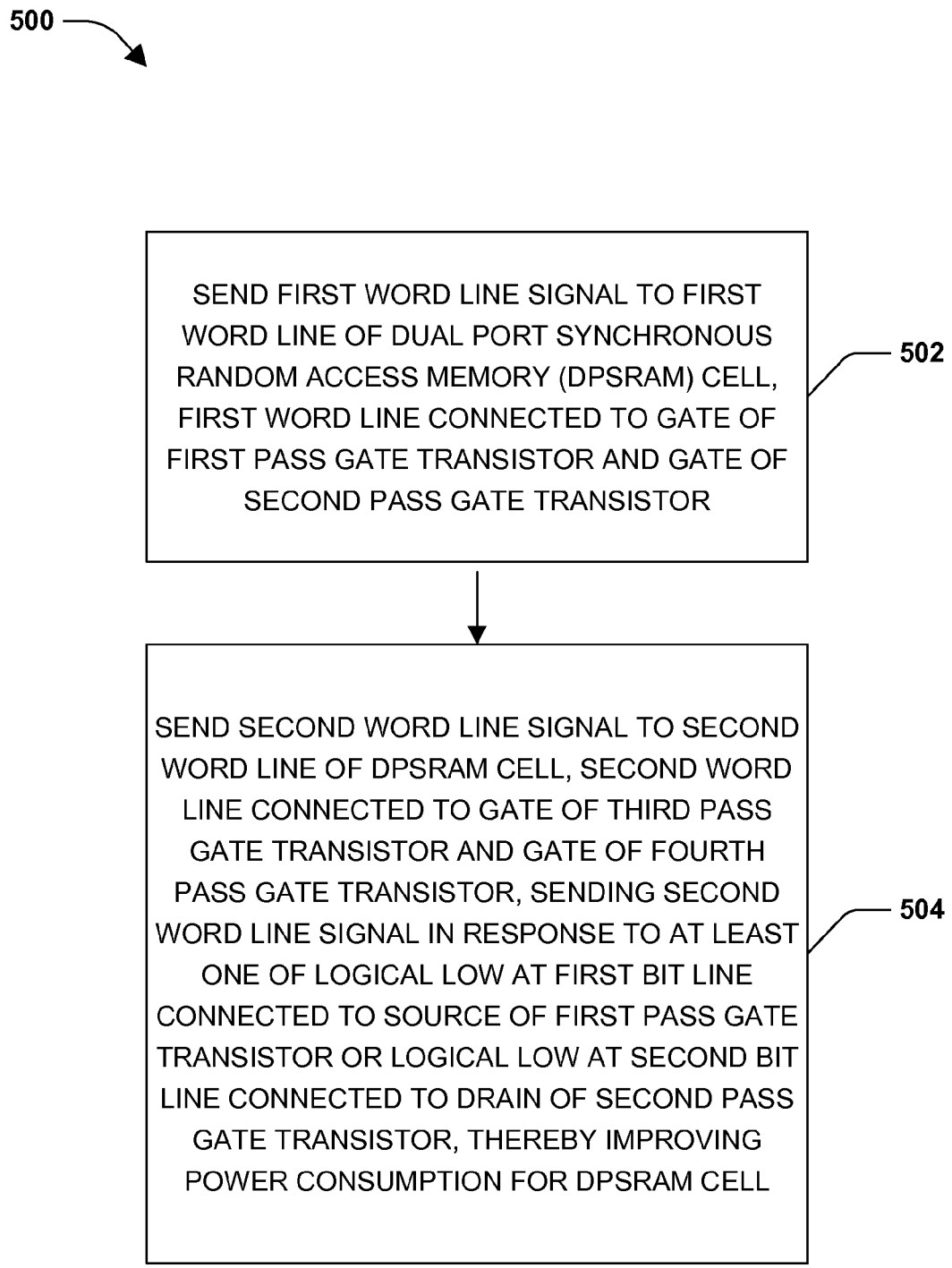
FIG. 5 is a flow diagram of an example method for improving Vccmin for a dual port synchronous random access memory (DPSRAM) cell utilized as a single port synchronous random access memory (SPSRAM) cell, according to some embodiments.

FIG. 5 is a flow diagram of an example method 500 for improving Vccmin for a dual port synchronous random access memory (DPSRAM) cell utilized as a single port synchronous random access memory (SPSRAM) cell, according to some embodiments. For example, at 502, a first word line signal is sent to a first word line of the DPSRAM cell. In some examples, the first word line is connected to a gate of a first pass gate transistor and a gate of a second pass gate transistor. At 504, a second word line signal is sent to a second word line of the DPSRAM cell. In some examples, the second word line signal is sent in response to at least one of a logical low at a first bit line connected to a source of the first pass gate transistor or a logical low at a second bit line connected to a drain of the second pass gate transistor, thereby improving Vccmin for DPSRAM cell. Additionally, the second word line is connected to a gate of a third pass gate transistor and a gate of a fourth pass gate transistor.

In some embodiments, the first word line signal is sent to the first word line of the DPSRAM cell by at least one of biasing the gate of the first pass gate transistor or biasing the gate of the second pass gate transistor. Similarly, the second word line signal is sent to the second word line of the DPSRAM cell by at least one of biasing the gate of the third pass gate transistor or biasing the gate of the fourth pass gate transistor.

In some embodiments, the first bit line is connected to a drain of a first pull down transistor based on the first word line signal. For example, when the first word line signal is sent to the first word line, the gate of the first pass gate transistor, such as the first pass gate transistor 120 of FIG. 1 is biased, thus turning the first pass gate transistor 120 on to connect the first bit line to the drain of the first pull down transistor, such as the first pull down transistor 114 of FIG. 1. Similarly, the second bit line is connected to a drain of a second pull down transistor based on the first word line signal. For example, when the first word line signal is sent to the first word line, the gate of the second pass gate transistor, such as the second pass gate transistor 122 of FIG. 1 is biased, thus turning the second pass gate transistor 122 on to connect the second bit line to the drain of the second pull down transistor, such as the second pull down transistor 116 of FIG. 1.

FIG. 6 is a flow diagram of an example method 600 for improving Vccmin for a dual port synchronous random access memory (DPSRAM) cell utilized as a single port synchronous random access memory (SPSRAM) cell, according to some embodiments. For example, at 602 at least one of a channel width, a channel length, or a channel width to channel length ratio is selected for at least one of a first pull up transistor, a second pull up transistor, a first pull down transistor, a second pull down transistor, a first pass gate transistor, a second pass gate transistor, a third pass gate transistor, or a fourth pass gate transistor of the DPSRAM cell based on sending a second word line signal to a second word line of the DPSRAM cell. In some examples, the second word line is connected to a gate of the third pass gate transistor and a gate of the fourth pass gate transistor. In some embodiments, the second word line signal is sent in response to at least one of a logical low at a first bit line connected to a source of the first pass gate transistor or a logical low at a second bit line connected to a drain of the second pass gate transistor, thereby improving Vccmin for the DPSRAM cell. In some examples, selection of at least one of the channel width, the channel length, or the channel width to channel length ratio is based on at least one of an alpha ratio for the DPSRAM cell or a beta ratio for the DPSRAM cell. In some embodiments, at least one of the alpha ratio or the beta ratio is determined at a time after the second word line signal is sent to the second word line in response to at least one of the logical low at the first bit line or the logical low at the second bit line. Additionally, the channel width to channel length ratio is calculated by dividing the channel width by the channel length, for example. In this way, an associated alpha ratio or beta ratio for a DPSRAM cell is adjusted such that the alpha ratio is independent of the beta ratio or vice versa, for example.

FIG. 7 is a flow diagram of an example method 700 for improving Vccmin for a dual port synchronous random access memory (DPSRAM) cell utilized as a single port synchronous random access memory (SPSRAM) cell, according to some embodiments. For example, at 702, a number of DPSRAM cells for a first bit line of a DPSRAM cell array is selected based on a pull down time associated with a change in a first bit line level of the first bit line in response to a first word line signal sent to a first word line. In some embodiments, the DPSRAM cell of the DPSRAM cell array is connected to the first word line and the first bit line via a first pass gate transistor, thereby improving Vccmin for DPSRAM cell. In some embodiments, the number of DPSRAM cells is selected for a second bit line of the DPSRAM cell array based on the pull down time. In other embodiments, a dummy read operation is performed based on at least one of the number of DPSRAM cells connected to the first bit line in the DPSRAM cell array or the number of DPSRAM cells connected to the second bit line in the DPSRAM cell array. Additionally, at least one of a channel width, a channel length, or a channel width to channel length ratio is selected for the first pass gate transistor based on the pull down time, in some embodiments.

Figure 8:
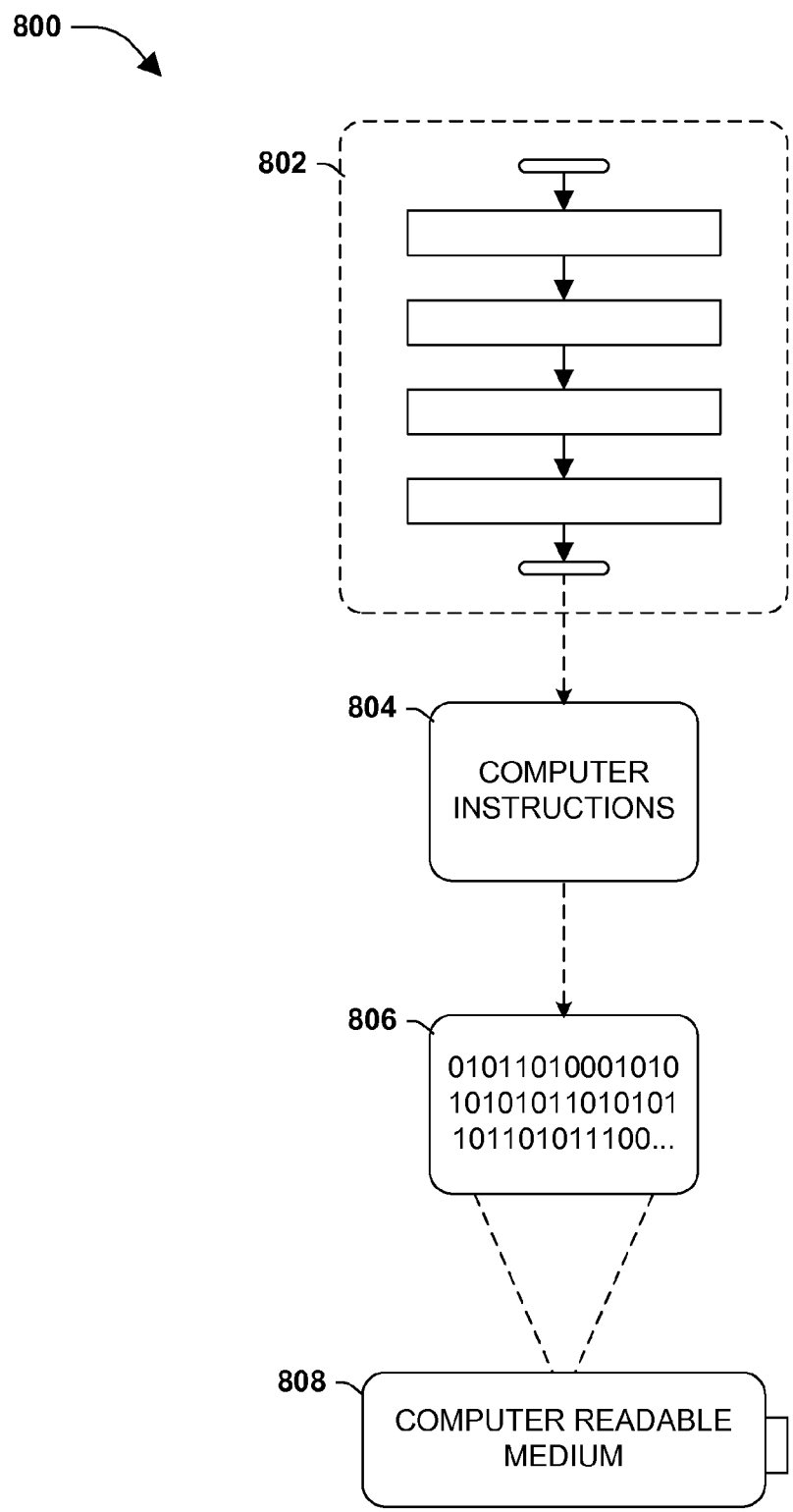
FIG. 8 is an illustration of an example computer-readable medium or computer-readable device comprising processor-executable instructions configured to embody one or more of the provisions set forth herein, according to some embodiments.

Still another embodiment involves a computer-readable medium comprising processor-executable instructions configured to implement one or more of the techniques presented herein. An example embodiment of a computer-readable medium or a computer-readable device that is devised in these ways is illustrated in FIG. 8, wherein the implementation 800 comprises a computer-readable medium 808, such as a CD-R, DVD-R, flash drive, a platter of a hard disk drive, etc., on which is encoded computer-readable data 806. This computer-readable data 806 in turn comprises a set of computer instructions 804 configured to operate according to one or more of the principles set forth herein. In one such embodiment 800, the processor-executable computer instructions 804 is configured to perform a method 802, such as at least some of the exemplary method 500 of FIG. 5, at least some of the exemplary method 600 of FIG. 6, or at least some of exemplary method 700 of FIG. 7, for example. Many such computer-readable media are devised by those of ordinary skill in the art that are configured to operate in accordance with the techniques presented herein.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

As used in this application, the terms "component", "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, or a computer. By way of illustration, both an application running on a controller and the controller can be a component. One or more components residing within a process or thread of execution and a component may be localized on one computer or distributed between two or more computers.

Furthermore, the claimed subject matter is implemented as a method, apparatus, or article of manufacture using standard programming or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Figure 9:
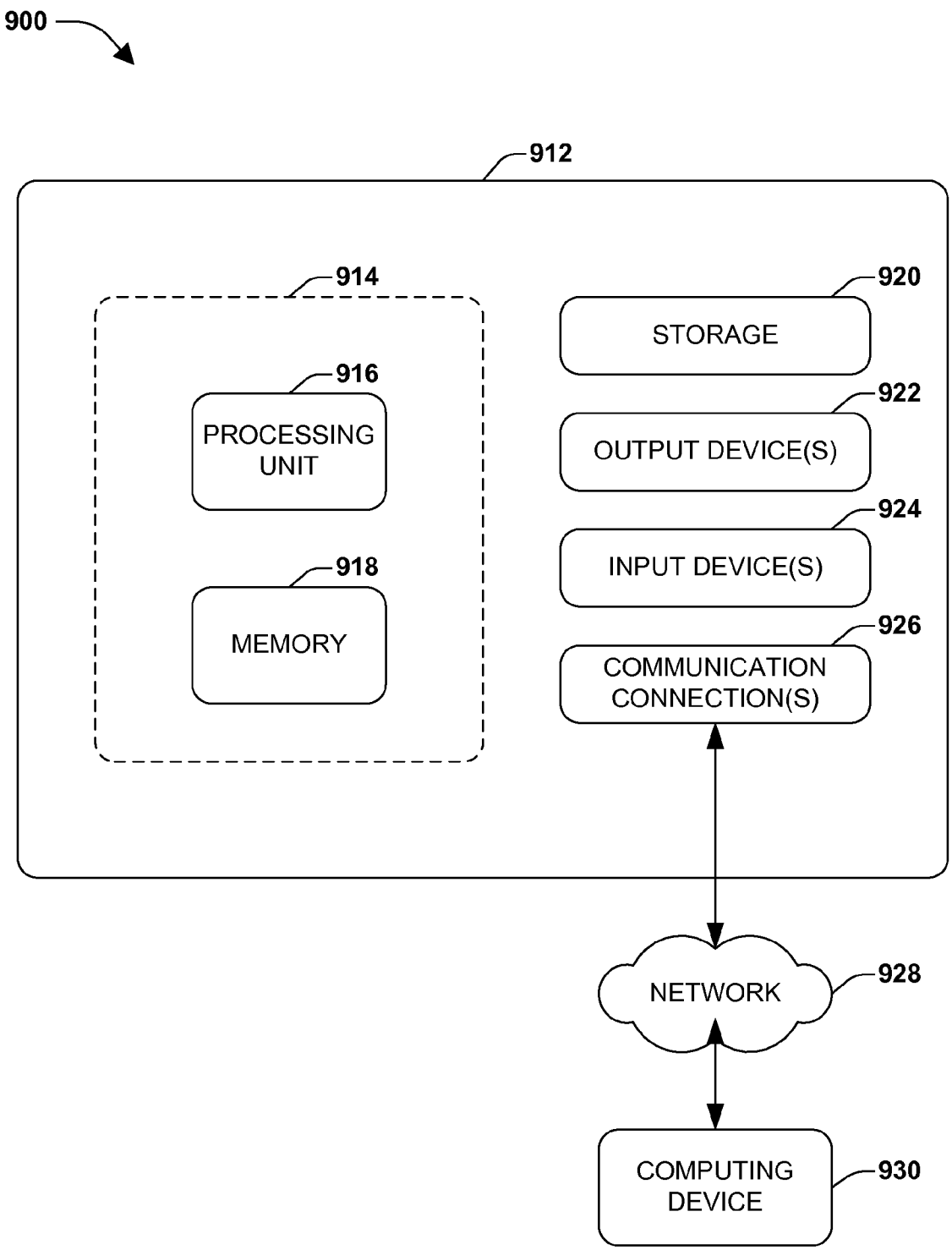
FIG. 9 is an illustration of an example computing environment where one or more of the provisions set forth herein are implemented, according to some embodiments.

FIG. 9 and the following discussion provide a brief, general description of a suitable computing environment to implement embodiments of one or more of the provisions set forth herein. The operating environment of FIG. 9 is only one example of a suitable operating environment and is not intended to suggest any limitation as to the scope of use or functionality of the operating environment. Example computing devices include, but are not limited to, personal computers, server computers, hand-held or laptop devices, mobile devices, such as mobile phones, Personal Digital Assistants (PDAs), media players, and the like, multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions are distributed via computer readable media as will be discussed below. Computer readable instructions are implemented as program modules, such as functions, objects, Application Programming Interfaces (APIs), data structures, and the like, that perform particular tasks or implement particular abstract data types. Typically, the functionality of the computer readable instructions are combined or distributed as desired in various environments.

FIG. 9 illustrates an example of a system 900 comprising a computing device 912 configured to implement one or more embodiments provided herein. In one configuration, computing device 912 includes at least one processing unit 916 and memory 918. Depending on the exact configuration and type of computing device, memory 918 may be volatile, such as RAM, non-volatile, such as ROM, flash memory, etc., or some combination of the two. This configuration is illustrated in FIG. 9 by dashed line 914.

In other embodiments, device 912 includes additional features or functionality. For example, device 912 also includes additional storage such as removable storage or non-removable storage, including, but not limited to, magnetic storage, optical storage, and the like. Such additional storage is illustrated in FIG. 9 by storage 920. In some embodiments, computer readable instructions to implement one or more embodiments provided herein are in storage 920. Storage 920 also stores other computer readable instructions to implement an operating system, an application program, and the like. Computer readable instructions are loaded in memory 918 for execution by processing unit 916, for example.

The term "computer readable media" as used herein includes computer storage media. Computer storage media includes volatile and nonvolatile, removable and non-removable media implemented in any method or technology for storage of information such as computer readable instructions or other data. Memory 918 and storage 920 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 912. Any such computer storage media is part of device 912.

The term "computer readable media" includes communication media. Communication media typically embodies computer readable instructions or other data in a "modulated data signal" such as a carrier wave or other transport mechanism and includes any information delivery media. The term "modulated data signal" includes a signal that has one or more of its characteristics set or changed in such a manner as to encode information in the signal.

Device 912 includes input device(s) 924 such as keyboard, mouse, pen, voice input device, touch input device, infrared cameras, video input devices, or any other input device. Output device(s) 922 such as one or more displays, speakers, printers, or any other output device are also included in device 912. Input device(s) 924 and output device(s) 922 are connected to device 912 via a wired connection, wireless connection, or any combination thereof. In some embodiments, an input device or an output device from another computing device are used as input device(s) 924 or output device(s) 922 for computing device 912. Device 912 also includes communication connection(s) 926 to facilitate communications with one or more other devices.

According to some aspects, a method for improving Vccmin for a dual port synchronous random access memory (DPSRAM) cell utilized as a single port synchronous random access memory (SPSRAM) cell is provided, comprising sending a first word line signal to a first word line of the DPSRAM cell. For example, the first word line is connected to a gate of a first pass gate transistor and a gate of a second pass gate transistor. In some embodiments, the method comprises sending a second word line signal to a second word line of the DPSRAM cell. For example, the second word line is connected to a gate of a third pass gate transistor and a gate of a fourth pass gate transistor. In some embodiments, the second word line signal is sent in response to at least one of a logical low at a first bit line connected to a source of the first pass gate transistor or a logical low at a second bit line connected to a drain of the second pass gate transistor, thereby improving Vccmin for the DPSRAM cell.

According to some aspects, a method for improving Vccmin for a dual port synchronous random access memory (DPSRAM) cell utilized as a single port synchronous random access memory (SPSRAM) cell is provided, comprising selecting at least one of a channel width, a channel length, or a channel width to channel length ratio for at least one of a first pull up transistor, a second pull up transistor, a first pull down transistor, a second pull down transistor, a first pass gate transistor, a second pass gate transistor, a third pass gate transistor, or a fourth pass gate transistor of the DPSRAM cell based on a second word line signal sent to a second word line of the DPSRAM cell. For example, the second word line is connected to a gate of the third pass gate transistor and a gate of the fourth pass gate transistor. In some embodiments, the second word line signal is sent in response to at least one of a logical low at a first bit line connected to a source of the first pass gate transistor or a logical low at a second bit line connected to a drain of the second pass gate transistor, thereby improving Vccmin for the DPSRAM cell.

According to some aspects, a computer-readable storage medium comprising computer-executable instructions, which when executed at least in part via a processing unit on a computer perform a method for improving Vccmin for a dual port synchronous random access memory (DPSRAM) cell utilized as a single port synchronous random access memory (SPSRAM) cell is provided, comprising selecting a number of DPSRAM cells for a first bit line of a DPSRAM cell array based on a pull down time associated with a change in a first bit line level of the first bit line in response to a first word line signal sent to a first word line, a DPSRAM cell of the DPSRAM cell array connected to the first word line and the first bit line via a first pass gate transistor, thereby improving Vccmin for the DPSRAM cell.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A method for improving Vccmin for a dual port synchronous random access memory (DPSRAM) cell utilized as a single port synchronous random access memory (SPSRAM) cell, comprising:
    sending a first word line signal to a first word line of a dual port synchronous random access memory (DPSRAM) cell, the first word line connected to a gate of a first pass gate transistor and a gate of a second pass gate transistor; and
    sending a second word line signal to a second word line of the DPSRAM cell, the second word line connected to a gate of a third pass gate transistor and a gate of a fourth pass gate transistor, sending the second word line signal in response to a logical low at a first bit line connected to the first pass gate transistor, the first bit line falling to the logical low in response to sending the first word line signal.

2. The method of claim 1, sending the first word line signal to the first word line of the DPSRAM cell comprising biasing the gate of the first pass gate transistor.

3. The method of claim 1, sending the first word line signal to the first word line of the DPSRAM cell comprising biasing the gate of the second pass gate transistor.

4. The method of claim 1, sending the second word line signal to the second word line of the DPSRAM cell comprising biasing the gate of the third pass gate transistor.

5. The method of claim 1, sending the second word line signal to the second word line of the DPSRAM cell comprising biasing the gate of the fourth pass gate transistor.

6. The method of claim 1, comprising connecting the first bit line to a first pull down transistor in response to sending the first word line signal.

7. The method of claim 1, comprising performing a dummy read operation with the DPSRAM cell.

8. The method of claim 7, comprising performing the dummy read operation based on a number of DPSRAM cells connected to the first bit line in a DPSRAM cell array.

9. The method of claim 1, comprising performing a read modify write operation with the DPSRAM cell.

10. The method of claim 9, comprising performing the read modify write operation based on a number of DPSRAM cells connected to the first bit line in a DPSRAM cell array.

11. The method of claim 1, sending the first word line signal to the first word line of the DPSRAM cell comprising sending a logical high to the first word line.

12. The method of claim 1, sending the second word line signal to the second word line of the DPSRAM cell comprising sending a logical high to the second word line.

13. A method for improving Vccmin for a dual port synchronous random access memory (DPSRAM) cell utilized as a single port synchronous random access memory (SPSRAM) cell, comprising:
    selecting at least one of a channel width, a channel length, or a channel width to channel length ratio for at least one of a first pull up transistor, a second pull up transistor, a first pull down transistor, a second pull down transistor, a first pass gate transistor, a second pass gate transistor, a third pass gate transistor, or a fourth pass gate transistor of a dual port synchronous random access memory (DPSRAM) cell based on:
        a second word line signal sent to a second word line of the DPSRAM cell, the second word line connected to a gate of the third pass gate transistor and a gate of the fourth pass gate transistor, the second word line signal sent in response to at least one of:
            a logical low at a first bit line connected to a source of the first pass gate transistor; or
            a logical low at a second bit line connected to a drain of the second pass gate transistor, thereby improving Vccmin for the DPSRAM cell, at least some of the selecting implemented at least in part via a processing unit.

14. The method of claim 13, comprising selecting at least one of the channel width, the channel length, or the channel width to channel length ratio for at least one of the first pull up transistor, the second pull up transistor, the first pull down transistor, the second pull down transistor, the first pass gate transistor, the second pass gate transistor, the third pass gate transistor, or the fourth pass gate transistor based on at least one of an alpha ratio for the DPSRAM cell or a beta ratio for the DPSRAM cell, at least one of the alpha ratio or the beta ratio determined at a time after the second word line signal is sent to the second word line in response to at least one of the logical low at the first bit line or the logical low at the second bit line.

15. The method of claim 13, comprising calculating the channel width to channel length ratio by dividing the channel width by the channel length.

16. A computer-readable storage medium comprising computer-executable instructions, which when executed at least in part via a processing unit on a computer perform a method for improving Vccmin for a dual port synchronous random access memory (DPSRAM) cell utilized as a single port synchronous random access memory (SPSRAM) cell, comprising:
    selecting a number of dual port synchronous random access memory (DPSRAM) cells for a first bit line of a DPSRAM cell array based on:

a pull down time associated with a change in a first bit line level of the first bit line in response to a first word line signal sent to a first word line, a DPSRAM cell of the DPSRAM cell array connected to the first word line and the first bit line via a first pass gate transistor, thereby improving Vccmin for the DPSRAM cell; and selecting at least one of a channel width, a channel length, or a channel width to channel length ratio for the first pass gate transistor based on the pull down time.

17. The computer-readable storage medium of claim 16, comprising selecting the number of DPSRAM cells for a second bit line of the DPSRAM cell array based on the pull down time.

18. The method of claim 1, a second bit line connected to the second pass gate transistor falling to logical low in response to sending the second word line signal.

19. The method of claim 18, comprising connecting the second bit line to a second pull down transistor in response to sending the second word line signal.

20. The method of claim 1, the DPSRAM cell performing a dummy read operation based upon the sending the first word line signal concurrently with a second DPSRAM cell connected to the first word line signal performing a write operation.

* * * * *